United States Patent [19]

Tsutsumi et al.

[11] Patent Number: 5,191,308

[45] Date of Patent: Mar. 2, 1993

[54] MAGNETOSTRICTIVE WAVE DEVICE HAVING A HIGHER MAXIMUM CUT-OFF BAND ELIMINATION FILTER

[75] Inventors: Makoto Tsutsumi, Hirakata; Toshio Nishikawa, Nagaokakyo, both of Japan

[73] Assignee: Murata Manufacturing Co., Ltd., Kyoto, Japan

[21] Appl. No.: 641,040

[22] Filed: Jan. 14, 1991

[30] Foreign Application Priority Data

Jan. 19, 1990 [JP] Japan .................................... 2-11004

[51] Int. Cl.$^5$ .............................................. H01F 7/02
[52] U.S. Cl. ..................................... 335/304; 333/202; 333/204; 333/219
[58] Field of Search ............... 335/304; 333/202, 204, 333/219, 219.2, 245, 246

[56] References Cited

U.S. PATENT DOCUMENTS

| | | | |
|---|---|---|---|
| 4,743,874 | 10/1988 | Kinoshita et al. | 333/219 |
| 4,777,462 | 10/1988 | Kunz et al. | 333/202 X |
| 4,782,312 | 11/1988 | Chang et al. | 333/202 X |
| 4,939,488 | 7/1990 | Tsutsumi | 333/219.2 X |
| 4,968,954 | 11/1990 | Ryho et al. | 333/193.9 X |
| 4,985,709 | 1/1991 | Nishikawa | 333/245 X |

FOREIGN PATENT DOCUMENTS 63-61416  9/1989  Japan ........................... 335/219.2

OTHER PUBLICATIONS

*Electronics and Communications in Japan*, vol. 55-B, No. 11, Nov. 1972, New York, pp. 43-49; Makoto Tsutsumi: "Magnetostatic Surface Waves in YIG Slabs Arbitrarily Magnetized Orthogonal to Direction of Propagation".

*Primary Examiner*—Leo P. Picard
*Assistant Examiner*—Trinidad Korka
*Attorney, Agent, or Firm*—Jordan and Hamburg

[57] ABSTRACT

This magnetostatic wave device includes a ferrimagnetic substrate like, for example, a YIG thin film. On this ferrimagnetic substrate a strip line is formed. One end of the strip line is connected to an input terminal and the other end is connented to an output terminal. A magnetic field is applied to the ferrimagnetic substrate by a magnet. In this case, the ferrimagnetic substrate is so disposed that a direction parallel to its principal plane and a direction perpendicular to its principal plane are not parallel to the direction of a line of magnetic force of the magnet.

9 Claims, 3 Drawing Sheets

F I G. 1
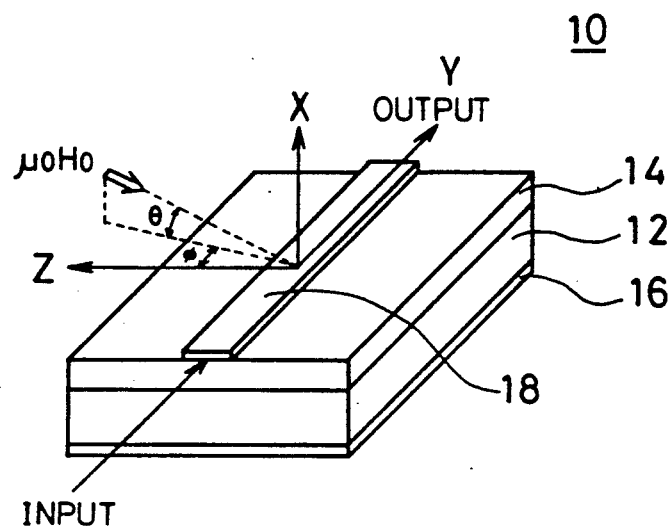
F I G. 2
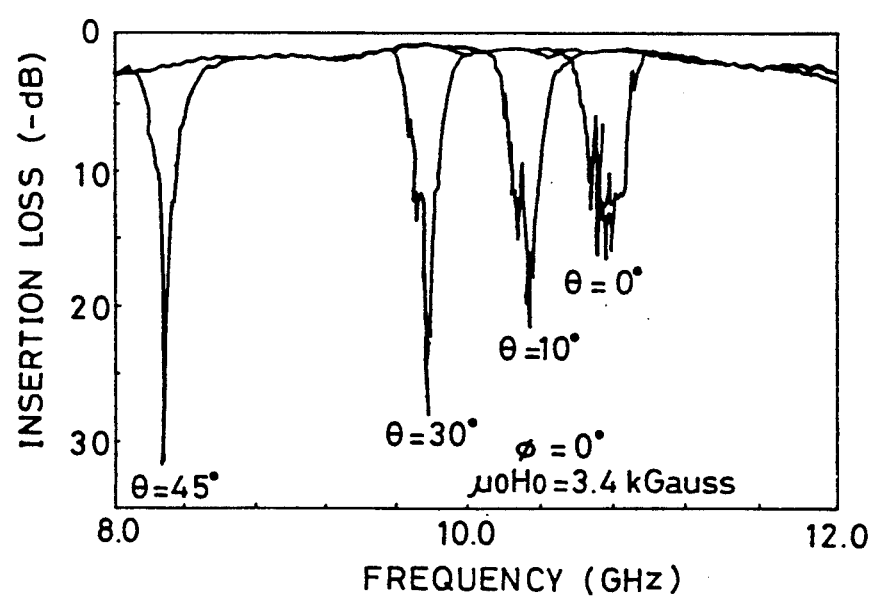

F I G. 3
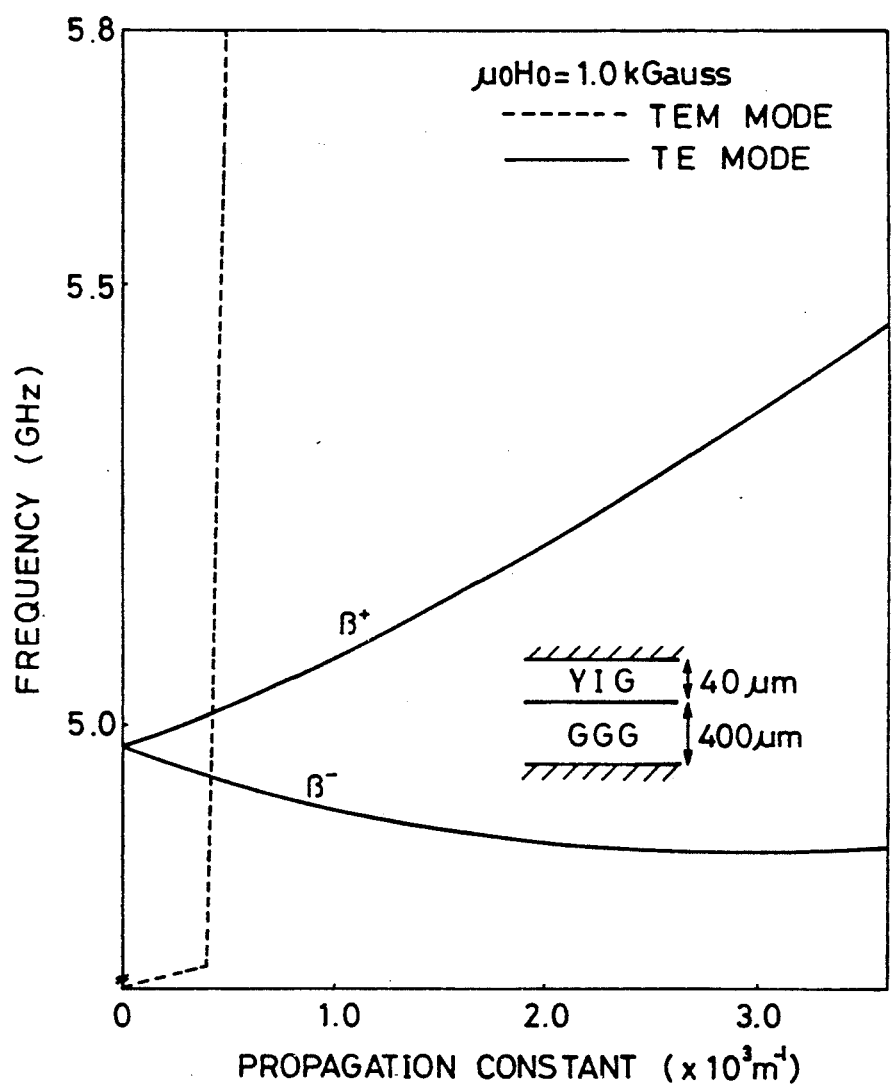

MAGNETOSTRICTIVE WAVE DEVICE HAVING A HIGHER MAXIMUM CUT-OFF BAND ELIMINATION FILTER

BACKGROUND OF THE INVENTION

1. Field of the Invention

This invention relates to a magnetostatic wave device and, more particularly, to the same which includes a ferrimagnetic substrate like, for example, a YIG thin film and is used as, for example, a filter.

2. Description of the Prior Art

FIG. 4 is a perspective view showing a magnetostatic wave resonator disclosed by Kinoshita et al. of Hitachi Co. in Ultrasonics symposium 1987, p.p. 213-216 as one example of the conventional magnetostatic wave devices forming background of the invention.

This magnetostatic wave resonator 1 includes a GGG (gadolinium, gallium, garnet) substrate 2, on one principal plane of which a YIG (Yttrium, iron, garnet) thin film 3 is formed and on the other principal plane an ground conductor 4 is formed.

On the YIG thin film 3, a rectangular input electrode 5 and a rectangular output electrode 6 are formed opposing apart in the longitudinal direction of the thin film 3. Further, on the YIG thin film 3, five narrow finger electrodes 7, 7, ... are formed spaced narrow distance apart in the width direction of the YIG thin film 3. In this case, one end of each of the electrodes 7, 7, ... is connected to the input electrode 5 and the other end is connected to the output electrode 6.

Further, the input electrode 5 and the ground conductor 4 are connected to respective input terminals, and the output electrode 6 and the ground conductor 4 are connected to respective output terminals.

A d.c. magnetic field is applied to the YIG thin film 3 in the direction parallel to its principal plane and parallel to the finger electrodes 7 as indicated with an arrow mark Ho of FIG. 4.

In the magnetostatic wave resonator 1, when a signal is inputted to the input terminal, a predetermined signal is outputted from the output terminal. In this case, a magnetostatic surface wave (MSSW) is propagated in the YIG thin film 3 in the width direction of the finger electrodes 7. A frequency characteristic of this magnetostatic wave resonator 1 is shown in FIG. 5.

FIG. 6 is a perspective view showing a magnetostatic wave resonator disclosed by Asao et al. of Mitsubishi Electric Co., in 1988 Institution of Electronics, Information and Communication, spring national conference report C-688 as another example of the conventional magnetostatic wave devices. In this magnetostatic wave resonator 1, a wide strip line 8 as compared with that of the resonator of FIG. 4 is formed on a YIG thin film 3. One end of the strip 8 and an ground conductor 4 are connected to respective input terminals, and the other end of the strip line 8 and the ground conductor 4 are connected to respective output terminals, and both the output terminals are short circuited. A d.c. magnetic field is applied to the YIG thin film 3 in the direction perpendicular to its principal plane as indicated with an arrow mark Ho of FIG. 6.

In the magnetostatic wave resonator 1, when a signal is inputted to the input terminal, a signal reflected at the short-circuited output terminal appears at the input terminal. At this time a magnetostatic forward volume wave (MSFVW) is propagated in the YIG thin film 3 in the width direction of the strip line 8.

However, in the magnetostatic wave resonator of FIG. 4, the maximum cut-off band elimination level, that is, the maximum attenuation levels is 22-23 dB at most and a ripple is large as shown in the frequency characteristic of FIG. 5.

Further, in the magnetostatic wave resonator of FIG. 6, the maximum cut-off band elimination level is small and the ripple is large.

SUMMARY OF THE INVENTION

Therefore, the principal object of the present invention is to provide a magnetostatic wave device having an improved maximum cut-off band elimination level and a reduced ripple.

The present invention relates to a magnetostatic wave device which comprises a ferrimagnetic substrate, a strip line formed on the ferrimagnetic substrate one end of which is connected to an input terminal and the other end is connected to an output terminal, and a magnet for applying a magnetic field to the ferrimagnetic substrate, which the ferrimagnetic substrate is so disposed that a direction parallel to its principal plane and a direction perpendicular to its principal plane are not parallel to a direction of a line of magnetic force of the magnet respectively.

Disposition of the ferrimagnetic substrate in such a manner that a direction parallel to its principal plane and a direction perpendicular to its principal plane are not parallel to a direction of a line of magnetic force of the magnet increases a loss of the magnetostatic wave in the ferrimagnetic substrate. As a result a favorable maximum cut-off band elimination level is obtained. In addition a cut-off elimination band-width is narrowed, thus the ripple is reduced.

According to the invention, a magnetostatic wave device having an improved maximum cut-off band elimination level and a reduced ripple can be obtained.

Further, the magnetostatic wave device of the invention has a simple structure, thus providing high productivity.

The above and other objects, features, aspects and advantages of the invention will become apparent from the following detailed description of the embodiments with reference to the accompanying drawings.

BRIEF DESCRIPTION OF THE DRAWINGS

FIG. 1 is a perspective view showing one embodiment of the present invention.

FIG. 2 is a graph showing frequency characteristics of the embodiment of FIG. 1.

FIG. 3 is a graph showing dispersion curves of a magnetostatic wave device.

DESCRIPTION OF THE PREFERRED EMBODIMENTS

Figure 4:
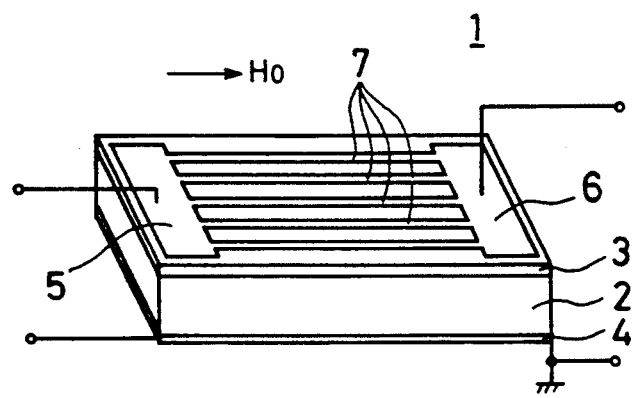
FIG. 4 is a perspective view showing one example of the conventional magnetostatic wave devices.
Figure 5:
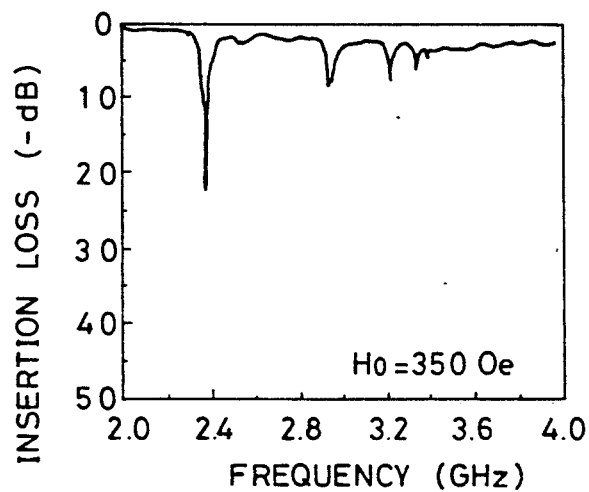
FIG. 5 is a graph showing a frequency characteristic of the conventional magnetostatic wave device of FIG. 4.
Figure 6:
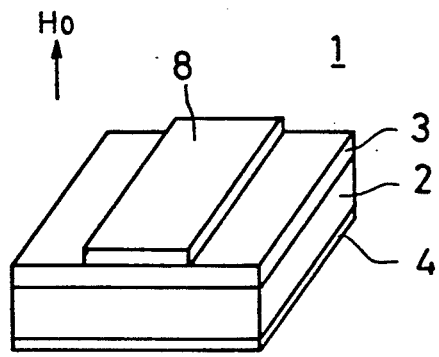
FIG. 6 is a perspective view showing another example of the conventional magnetostatic wave devices.

FIG. 1 is a perspective view showing one embodiment of the invention. This magnetostatic wave device 10 includes a GGG substrate 12 of, for example, 10 mm width, 20 mm length and 400 μm thickness as a base substance.

On one principal plane of the GGG substrate 12, a YIG thin film 14 of, for example, 20 μm thickness is formed as a ferrimagnetic substrate. On the other principal plane of the GGG substrate 12, a ground conductor 16 is formed.

Further, a strip line 18 of, for example, 0.7 mm width is formed on a longitudinal center line of the YIG thin film 14.

One end of the strip line 18 and the ground conductor 16 are connected to respective input terminals, for example, a coaxial connector (not shown), and the other end of the strip line 18 and the ground conductor 16 are connected to a coaxial connector (not shown) as output terminals.

Further, near the YIG thin film 14, a magnet (not shown) is disposed for applying a d.c. magnetic field to the YIG thin film 14. In this embodiment, when a direction perpendicular to the YIG thin film 14 principal plane as X, a longitudinal direction of the strip line 18 as Y, and a width direction of the strip line 18 as Z, the magnet is so disposed that its line of magnetic force has a direction forming an angle $\theta$ to the X-Z plane and an angle $\phi$ with the Z-direction in the Y-Z plane (direction indicated with an arrow $\mu_o H_o$).

FIG. 2 is a graph showing frequency characteristics of this embodiment. The graph of FIG. 2 shows frequency characteristics at the angle=0°, 10°, 30° and 45° taking 3.4 kG as a magnetic flux density in the direction indicated by the arrow mark $\mu_o H_o$ and 0° as the angle $\phi$.

As can be seen from the graph of FIG. 2, in the magnetostatic wave device 10, an insertion loss is small and less than 2 dB, further the maximum cut-off band elimination level becomes large and the ripple becomes small as the angle $\theta$ is increased within the range of 0° to 45°.

The reason why the maximum cut-off band elimination level becomes large in this manner is as follows.

It is well known that generally in a ferrimagnetic substrate like the YIG thin film, TE mode and TEM mode degenerate. Further in the magnetostatic wave device using the ferrimagnetic substrate as a substrate and forming a strip line on its surface, both the above modes combine in a complicated manner including a structural factor.

However, assuming that the ferrimagnetic substrate is magnetized in the direction of the strip line width and the wave does not depend on the direction of the strip line width, the problem of this combination can be simply evaluated. That is, the TE mode is affected by the permeability of the ferrimagnetic substrate but the TEM mode is not affected whereby. Making the dispersion curves of the system on this, the curves become as shown in FIG. 3.

In FIG. 3, the dispersion curve of the TEM mode and the dispersion curve of the minimum order (magnetostatic wave mode) of the TE mode are shown adjusting the magnetic flux density to 1.0K Gauss and using a YIG thin film of 40 μm thickness as the ferrimagnetic substrate and a GGG substrate of 400 μm thickness d. As can be seen from FIG. 3, the dispersion curves of the TE mode and the TEM mode degenerate (meet) about propagation constant 400 $m^{-1}$. It can be also seen that the frequency at the degeneration point differs in a traveling wave $\beta^+$ and in a backward wave $\beta^-$ and these frequencies are irreversible.

Further, when the direction of a line of magnetic force applied to the ferrimagnetic substrate is sloped like in this embodiment, strong combination between the TEM mode and the TE mode is caused at the degeneration point. The TE mode (magnetostatic wave mode) dispersion curve resulting from this combination shows a negative group velocity characteristic and results in a long delay time. Thus, a loss of the magnetostatic wave becomes large and a good maximum cut-off band elimination level can be obtained.

Further, the reason why the ripple is reduced as the angle $\theta$ is increased in this embodiment is that a bandwidth of the TE mode dispersion curve is narrowed, thereby a cut-off elimination band-width is narrowed.

In addition, the reason why a cut-off center frequency is varied depending on the angle $\theta$ in this embodiment is that the degeneration point is shifted toward a low frequency and an internal magnetic field intensity of the YIG thin film 14 is varied depending on the angle $\theta$. That is, when the angle $\theta$ is increased, the internal magnetic field intensity of the YIG thin film 14 is reduced, and the cut-off center frequency is lowered.

In the above embodiment, the direction of a line of magnetic force of the magnet was so determined that it is directed from the side of the strip line and it forms the angle $\theta$ with the YIG thin film principal plane, thus in short, in the present invention the direction of a line of magnetic force of the magnet should intersect a plane parallel to the YIG thin film principal plane and with a plane perpendicular to that principal plane.

It will be apparent from the foregoing that, while the present invention has been described and illustrated in detail, these are only particular illustrations and examples, and the invention is not limited to these. The spirit and scope of the invention is limited only by the appended claims.

What is claimed is:

1. A magnetostatic wave device comprising:
    a ferrimagnetic substrate;
    a strip line formed on said ferrimagnetic substrate, one end of which is connected to an input terminal and the other end of which is connected to an output terminal; and
    a magnet for applying a magnetic field to said ferrimagnetic substrate;
    said ferrimagnetic substrate being oriented with the direction of lines of force of the magnet being at a non-zero angle to the principal plane of the substrate and at a non-zero angle to the perpendicular to said principal plane.

2. A magnetostatic wave device according to claim 1, wherein said ferrimagnetic substrate includes a YIG thin film.

3. A magnetostatic wave device according to claim 2, which further comprises a GGG substrate, on one principal plane of which said YIG thin film is formed.

4. A magnetostatic wave device according to claim 3, which further comprises a ground conductor formed on the other principal plane of said GGG substrate.

5. The magnetostatic wave device of claim 1 in which said lines of magnetic force extending at an angle of $\Phi=0°$ with respect to a plane defined by the principal plane and a perpendicular to the principal plane, and a direction $\Theta=10°$ with respect to the principal plane.

6. The magnetostatic wave device of claim 1 in which said lines of magnetic force extending at an angle of $\Phi=0°$ with respect to a plane defined by the principal plane and a perpendicular to the principal plane, and a direction Θ=30° with respect to the principal plane.

7. The magnetostatic wave device of claim 1 in which said lines of magnetic force extending at an angle of Φ=0° with respect to a plane defined by the principal plane and a perpendicular to the principal plane, and a direction Θ=45° with respect to the principal plane.

8. A magnetostatic wave device comprising:
   a ferrimagnetic substrate having a surface with a principal plane;
   a strip line formed on said ferrimagnetic substrate, one end of which is connected to an input terminal and the other end of which is connected to an output terminal; and
   means for applying a magnetic field to said ferrimagnetic substrate in a direction that is at a non-zero angle to said principal plane and that is at a non-zero angle to the perpendicular to said principal plane.

9. A magnetostatic wave device comprising:
   a ferrimagnetic substrate having a first surface with a principal plane;
   a strip line formed on said ferrimagnetic substrate, one end of said strip line being connected to an input terminal and the other end of the strip line being connected to an output terminal;
   said ferrimagnetic substrate having a second surface opposite said first surface;
   a ground conductor on said second surface; and
   means for applying a magnetic field to said ferrimagnetic substrate in a direction that is at a non-zero angle to said principal plane and that is at a non-zero angle to the perpendicular to said principal plane.

* * * * *